United States Patent
Verploegh et al.

(10) Patent No.: US 12,235,304 B2
(45) Date of Patent: Feb. 25, 2025

(54) MULTI-CHANNEL QUANTUM-SENSING RADIOFREQUENCY RECEPTION

(71) Applicant: ColdQuanta, Inc., Boulder, CO (US)

(72) Inventors: Shane A. Verploegh, Boulder, CO (US); Eric Magnuson Bottomley, Broomfield, CO (US)

(73) Assignee: ColdQuanta, Inc., Boulder, CO (US)

( * ) Notice: Subject to any disclaimer, the term of this patent is extended or adjusted under 35 U.S.C. 154(b) by 210 days.

(21) Appl. No.: 17/990,357

(22) Filed: Nov. 18, 2022

(65) Prior Publication Data
US 2024/0003952 A1  Jan. 4, 2024

Related U.S. Application Data

(60) Provisional application No. 63/298,146, filed on Jan. 10, 2022.

(51) Int. Cl.
*G01R 29/08* (2006.01)
(52) U.S. Cl.
CPC .............................. *G01R 29/0885* (2013.01)
(58) Field of Classification Search
CPC .................................................. G01R 29/0885
USPC ......................................................... 324/629
See application file for complete search history.

(56) References Cited

U.S. PATENT DOCUMENTS

| | | | |
|---|---|---|---|
| 10,979,147 B2 | 4/2021 | Gordon | |
| 11,165,505 B2 | 11/2021 | Gordon | |
| 2006/0114003 A1* | 6/2006 | Onishi | G01R 29/0885 324/632 |
| 2007/0153254 A1* | 7/2007 | Huang | G01R 29/0885 356/4.01 |
| 2008/0260323 A1* | 10/2008 | Jalali | G01R 29/0885 385/12 |
| 2015/0185256 A1* | 7/2015 | Fujinoki | A61B 5/369 324/96 |
| 2016/0178843 A1* | 6/2016 | Fujita | H01Q 1/00 385/14 |
| 2016/0363617 A1 | 12/2016 | Anderson | |
| 2019/0187198 A1* | 6/2019 | Anderson | G01R 29/0878 |

(Continued)

OTHER PUBLICATIONS

Anderson et al., Rydberg atoms for radio-frequency communications and sensing: atomic receivers for pulsed RF field and phase detection, Rydberg Technologies Inc., Ann Arbor, MI 48103 USA; Oct. 18, 2019, 10 pages.

(Continued)

*Primary Examiner* — Christopher P McAndrew
(74) *Attorney, Agent, or Firm* — Schwegman Lundberg & Woessner, P.A.

(57) ABSTRACT

A quantum-sensing radiofrequency (RF) receiver system includes a multi-channel single-cell detection cell containing rubidium 87 atoms. Each channel is tuned to a respective RF frequency by applying electric potentials to indium-titanium-oxide (ITO) electrodes formed on detection cell walls. The channels are tuned to different RF frequencies to provide a relatively wideband detection in the aggregate across plural channels. A laser system provides plural laser beams, including a respective probe beam, to each channel to excite the $^{87}$Ru atoms therealong to a Rydberg state. Each channel can be read out by tracking absorption for each of the plural probe beams of the multi-channel system.

20 Claims, 6 Drawing Sheets

(56) References Cited

U.S. PATENT DOCUMENTS

| | | | |
|---|---|---|---|
| 2020/0011913 A1* | 1/2020 | Hisatake | G01R 29/0885 |
| 2020/0292606 A1 | 9/2020 | Holloway | |
| 2021/0263089 A1* | 8/2021 | Hisatake | G02B 6/262 |
| 2021/0270882 A1 | 9/2021 | Imhof | |
| 2022/0276293 A1* | 9/2022 | Compton | H04K 3/45 |
| 2022/0334162 A1* | 10/2022 | Cox | G01R 29/0885 |
| 2023/0137266 A1* | 5/2023 | McBride | G01R 29/0885 250/389 |

OTHER PUBLICATIONS

Berweger et al., Rydberg state engineering: A comparison of tuning schemes for continuous frequency sensing, Sep. 28, 2022; 11 pages.

Berweger et al., Rydberg-State Engineering: Investigations of Tuning Schemes for Continuous Frequency Sensing, Physical Review Applied 19, 044049, 13 pages, Apr. 18, 2023.

Bohaichuk et al., The Origins of Rydberg Atom Electrometer Transient Response and its Impact on Radio Frequency Pulse Sensing, Quantum Valley Ideas Laboratories, Sep. 13, 2022, 20 pages.

Cai et al., Sensitivity improvement of Rydberg atom-based microwave sensing via electromagnetically induced transparency, Nov. 15, 2021, 8 pages.

Carr et al., Three-photon electromagnetically induced transparency using Rydberg states, Optics Letters / vol. 37, No. 18, Sep. 15, 2012, 3 pages.

Carter et al., Electric field sensing near the surface microstructure of an atom chip using cold Rydberg atoms, Department of Physics and Astronomy and Institute for Quantum Computing, University of Waterloo, Dec. 21, 2013, 7 pages.

Daschner et al., Triple stack glass-to-glass anodic bonding for optogalvanic spectroscopy cells with electrical feedthroughs, Physikalisches Institut, Mar. 5, 2014, 4 pages.

David Henry Meyer, Magnetic & Electric Field Sensing and Applications Based on Coherent Effects in Neutral Atoms, 2018, 265 pages.

Fan et al., Atom Based RF Electric Field Sensing, Journal of Physics B: Atomic, Molecular and Optical Physics, Topical Review, published Sep. 9, 2015, pp. 1-16.

Fan et al., Sub-wavelength microwave electric field imaging using Rydberg atoms inside atomic vapor cells, Homer L. Dodge Department of Physics and Astronomy, The University of Oklahoma, Mar. 14, 2014, 5 pages.

Grabowski et al., High Resolution Rydberg Spectroscopy of ultracold Rubidium Atoms, Aug. 25, 2016, 9 pages.

Holloway et al., Broadband Rydberg Atom Based Self-Calibrating RF E-Field Probe, National Institute of Standards and Technology (NIST), Electromagnetics Division, 3 pages.

Holloway et al., Broadband Rydberg Atom-Based Electric-Field Probe: From Self-Calibrated Measurements to Sub-Wavelength Imaging, National Institute of Standards and Technology (NIST), U.S. Department of Commerce, Boulder Laboratories, May 27, 2014, 12 pages.

Holloway et al., Electric field metrology for SI traceability: Systematic measurement uncertainties in electromagnetically induced transparency in atomic vapor, Journal of Applied Physics 121, 233106; doi: 10.1063/1.4984201, 2017, 10 pages.

Holloway et al., Electromagnetically induced transparency based Rydberg-atom sensor for quantum voltage measurements, Oct. 26, 2021, 13 pages.

Hu et al., Continuously tunable radio frequency electrometry with Rydberg atoms, Appl. Phys. Lett. 121, 014002; https://doi.org/10.1063/5.0086357, Jul. 7, 2022, 7 pages.

Kilian Talo Theodor Singer, Interactions in an ultracold gas of Rydberg atoms, Oct. 2004, 133 pages.

Mao et al., A high-efficiency fiber-coupled Rydberg-atom integrated probe and its imaging applications, IEEE Antennas and Wireless Propagation Letters, 2022, 5 pages.

Meyer et al., Optimal Atomic Quantum Sensing using EIT Readout, Aug. 9, 2021, 12 pages.

Otto et al., Data capacity scaling of a distributed Rydberg atomic receiver array, Department of Physics, QSO-Centre for Quantum Science, and Dodd-Walls Centre, University of Otago, Dunedin, New Zealand, Apr. 8, 2021, 10 pages.

Prajapati et al., Enhancement of electromagnetically induced transparency based Rydberg-atom electrometry through population repumping, Aug. 31, 2021, 5 pages.

Prajapati et al., TV and Video Game Streaming with a Quantum Receiver: A Study on a Rydberg atom-based receiver's bandwidth and reception clarity, National Institute of Standards and Technology, May 13, 2022, 6 pages.

Renate Daschner, Addressable Rubidium vapor cells for optical and electrical read-out of Rydberg excitations, 2015, 195 pages.

Ripka et al., Rydberg atom-based radio frequency: hyperfine effects, Proc. SPIE 12016, Optical and Quantum Sensing and Precision Metrology II, 1201601, Mar. 2, 2022, 7 pages.

Simons et al., Continuous radio frequency electric-field detection through adjacent Rydberg resonance tuning, Oct. 9, 2021, 9 pages.

Simons et al., Using frequency detuning to improve the sensitivity of electric field measurements via electromagnetically induced transparency and Autler-Townes splitting in Rydberg atoms, Applied Physics Letters 108, 174101; doi: 10.1063/1.4947231, 2016, 6 pages.

Teale et al., Degenerate two-photon Rydberg atom voltage reference, AVS Quantum Sci. 4, 024403; https://doi.org/10.1116/5.0090892, Jun. 15, 2022, 6 pages.

Thaicharoen et al., Electromagnetically-induced transparency, absorption, and microwave field sensing in a Rb vapor cell with a three-color all-infrared laser system, May 27, 2019, 9 pages.

Van Ditzhuijzen et al., Simultaneous position and state measurement of Rydberg atoms, Eur. Phys. J. D 40, 13-17. DOI: 10.1140/epjd/e2006-00140-1, Jun. 21, 2006, 6 pages.

You et al., Microwave-field sensing via electromagnetically induced absorption of Rb irradiated by three-color infrared lasers, vol. 30, No. 10, Optics Express, May 9, 2022, 11 pages.

* cited by examiner

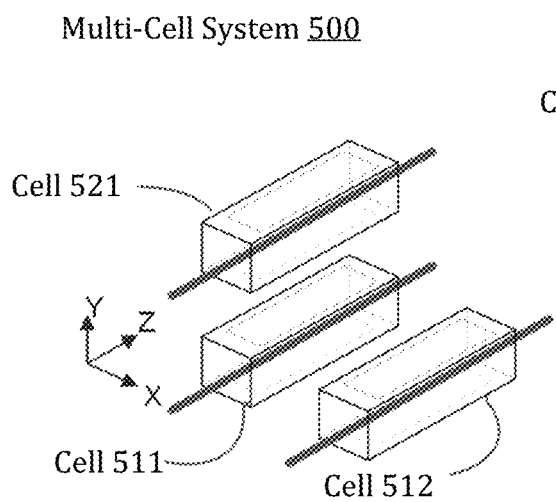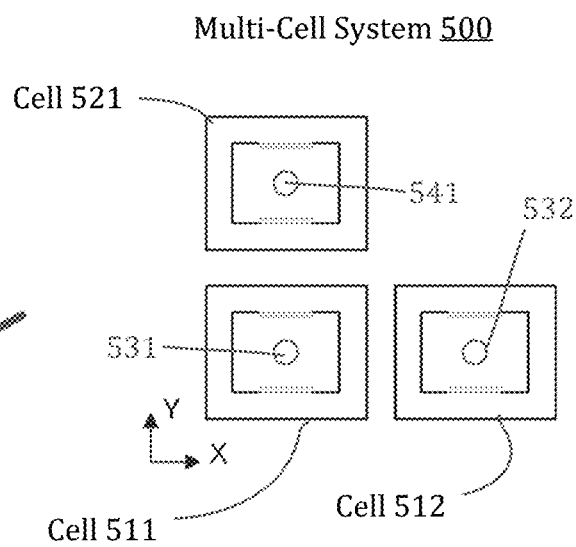
Multi-Cell System 500
FIG. 5A
Multi-Cell System 500
FIG. 5B

MULTI-CHANNEL QUANTUM-SENSING RADIOFREQUENCY RECEPTION

CROSS REFERENCE TO OTHER APPLICATIONS

This application claims priority to U.S. Provisional Patent Application No. 63/298,146 entitled RYDBERG CHANNEL AGGREGATION filed Jan. 10, 2022 which is incorporated herein by reference for all purposes.

BACKGROUND OF THE INVENTION

Very high frequency (VHF) and ultra-high frequency (UHF) radio signals have applications in FM broadcasts, television broadcasts, cable television broadcasting, radar, line-of-sight ground-to-aircraft and aircraft-to-aircraft communications, radioteletype, land mobile and maritime mobile communications, amateur radio, weather radio, and cordless phones. Classical VHF and UHF sensors scale with signal wavelengths, which, for VHF, range from 10 centimeters to ten meters (for 30 MHz to 3000 MHz signals), and thus may be impractically large for some applications. Quantum sensors, e.g., those based on electromagnetically induced transparency (EIT) do not scale with wavelength and can be far more sensitive than their classical counterparts.

An EIT-based sensor can include a hermetically sealed cell containing an atomic vapor, e.g., of rubidium 87 (87Rb) atoms, cesium 133 (133Cs) atoms, or other isotopes of these elements, other atoms, or other molecular entities. Such a sensor senses only a narrow bandwidth of signals depending on the atomic element, isotope, Rydberg states employed, etc., used for detection. Such a sensor may be tuned (e.g., swept) to cover a wider bandwidth. However, sweeping can cause some information to be lost, e.g., because information is out-of-sync with respect to the sweeping. What is needed is a quantum sensor system that does not lose information due to frequency sweeping.

BRIEF DESCRIPTION OF THE DRAWINGS

FIGS. 5A and 5B are perspective and elevational views, respectively, of a two-dimensional array of single-channel atom-vapor cells for use in a multi-channel receiver.

DETAILED DESCRIPTION

The present invention provides a radiofrequency (RF) receiver that has plural quantum-sensor detection channels tuned to different frequencies to achieve relatively wideband detection in the aggregate. Each channel contains a population of quantum particles (e.g., atoms or polyatomic molecules) excited to Rydberg states. Each channel tracks the RF intensity for its respective narrow frequency band by tracking absorption of a probe beam that has passed through the quantum particles.

In "single-cell multi-channel" embodiments, plural channels extend through the same atom-vapor cell so that there is no solid barrier between the quantum-particle populations; in other embodiments, each channel has its own cell so that the quantum-particle populations are hermetically sealed from each other. However, in some multi-channel cells, quantum-particle populations can be concentrated along respective channels, e.g., using optical, magnetic, or magneto-optical confinement and/or traps. The single-cell design is more compact and more robust than a system assembled using single-channel cells. Also, cell failure is more readily detected since multiple channels are affected concurrently. Both designs offer improved performance for frequency hopping and other multi-frequency transmission environments.

Figure 1:
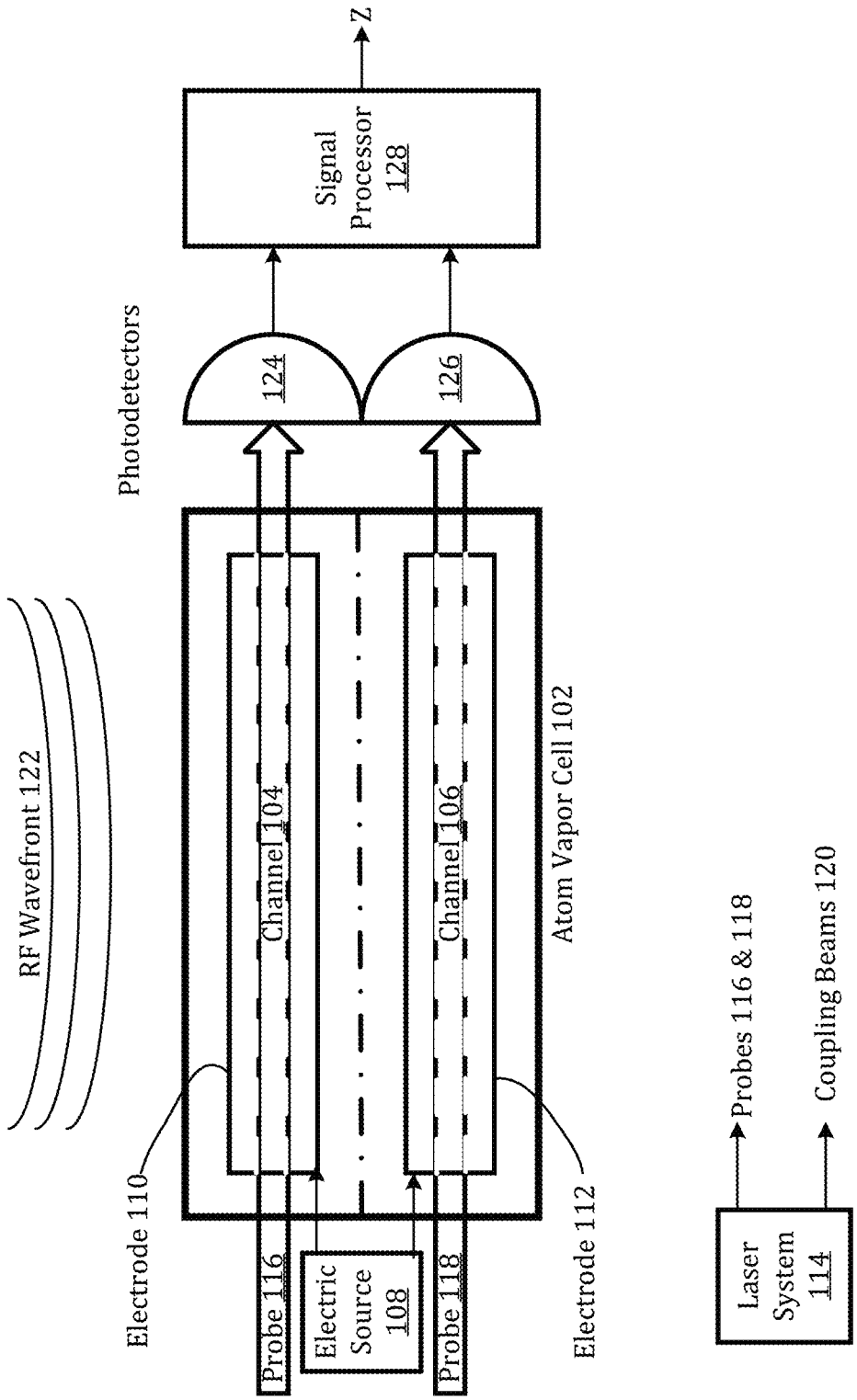
FIG. 1 is a schematic illustration of a multi-channel quantum-sensing radiofrequency (RF) receiver.
Figure 2A:
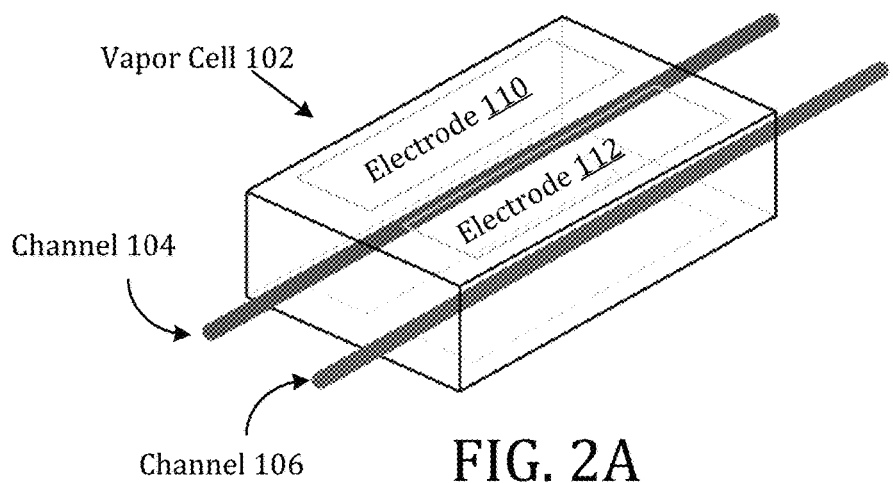
FIGS. 2A and 2B are perspective and elevational schematic views of an atom vapor cell of the receiver of FIG. 1.
Figure 2B:
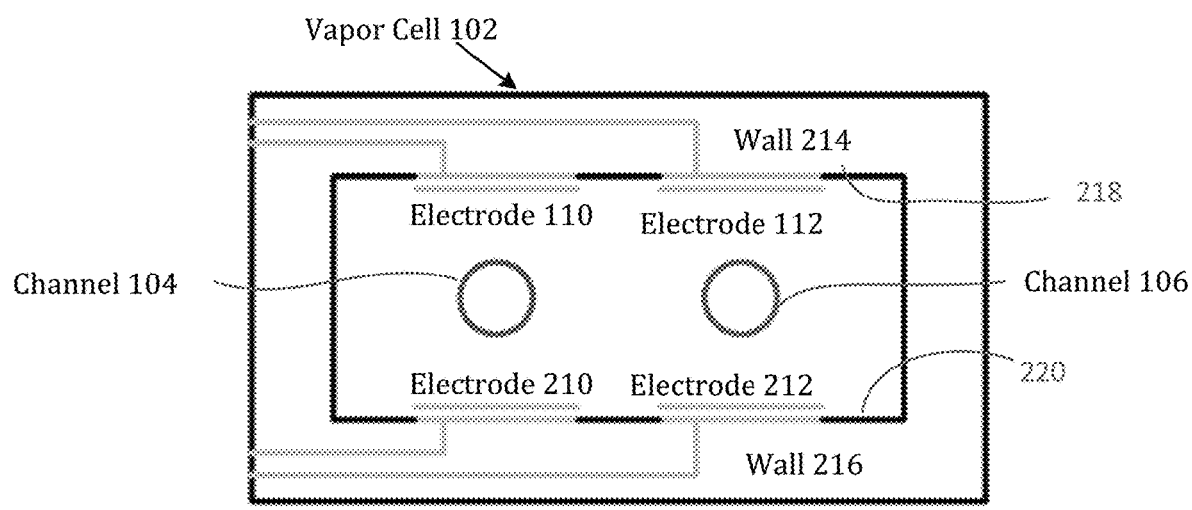

A single-cell dual-channel quantum-sensor receiver 100 is shown schematically in FIG. 1 including a hermetically sealed atom-vapor cell 102 in the form of a rectangular parallelepiped. Additional views of cell 102 are provided in FIGS. 2A and 2B. Cell 102 contains a vapor of rubidium 87 (87Ru) atoms; other embodiments employ other atoms or molecules. Channels 104 and 106 are defined through cell 102 and differentiated by their respective electric fields.

These electric fields are controlled by an electric source 108 via respective electrodes 110 (for channel 104) and 112 (for channel 106). Electric source 108 provides a respective AC voltage with a respective DC offset to electrodes 110 and 112. The respective DC offsets are chosen to tune, using a Stark effect, the respective channels 104 and 106 to respective frequencies f1 and f2. The respective AC frequencies f1 and f2 are used to demodulate the carriers for channels 104 and 106, respectively.

Figure 3:
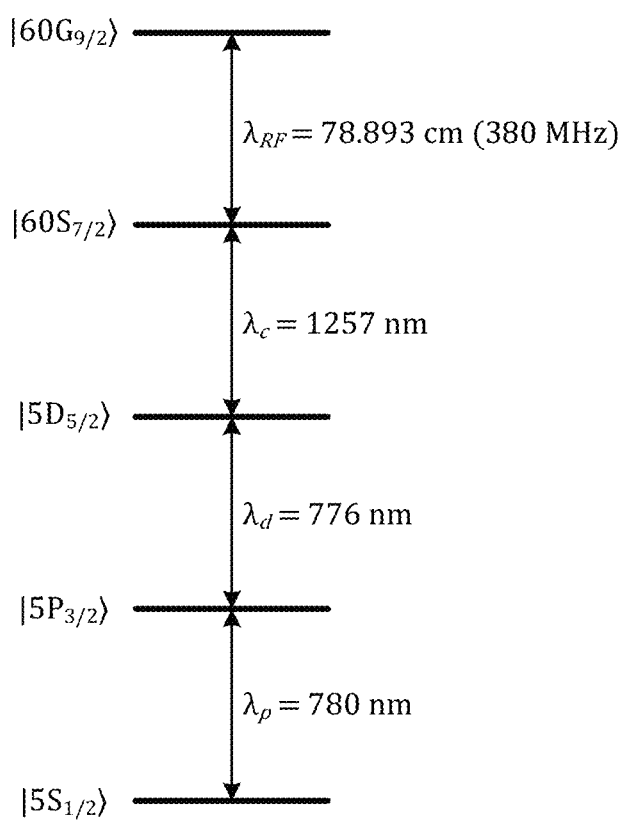
FIG. 3 is an energy-level diagram for energy-level transitions used in the receiver of FIG. 1.

A laser system 114 provides probe beams 116 and 118 and coupling beams 120 that are used to excite the 87Ru atoms to a Rydberg state |60S7/2⟩ ; in other embodiments, different Rydberg states are reached. As shown in the energy-level diagram of FIG. 3, a λp=780 nm probe can transition an 87Ru atom from a |55l/2⟩ ground state to a |5P3/2⟩ excited state. A λd=776 nm first coupling (aka "dressing") beam can transition an 87Ru atom from the |5P3/2⟩ excited state to an |5D5/2⟩ excited states. A λc=1257 nm second coupling beam can transition an 87Ru atom from the |5D5/2⟩ excited state to the |60S7/2⟩ Rydberg state.

In the absence of an RF wavefront, the probe beam is absorbed to some extent as it passes through the 87Ru atoms in the states listed above. However, in the presence of a 380 MHz (78.893 cm) radiofrequency wavefront 120, atoms in the |60S7/2⟩ Rydberg state can transition to a |60G9/2⟩ Rydberg state from which they cannot readily return to the |5S1/2⟩ ground state required for the probe beam to be absorbed; other frequencies can be used depending on channel tuning. Accordingly, the absorption peak that characterizes the absence of an RF field is reduced in the presence of the RF field of the proper frequency. Photodetectors 124 and 126 (FIG. 1) respectively track absorption of probes 116 and 118 so that the intensity of the pertinent RF field can be determined. Signal processor 128 then converts the photodetector readouts for an application specific use.

Figure 4:
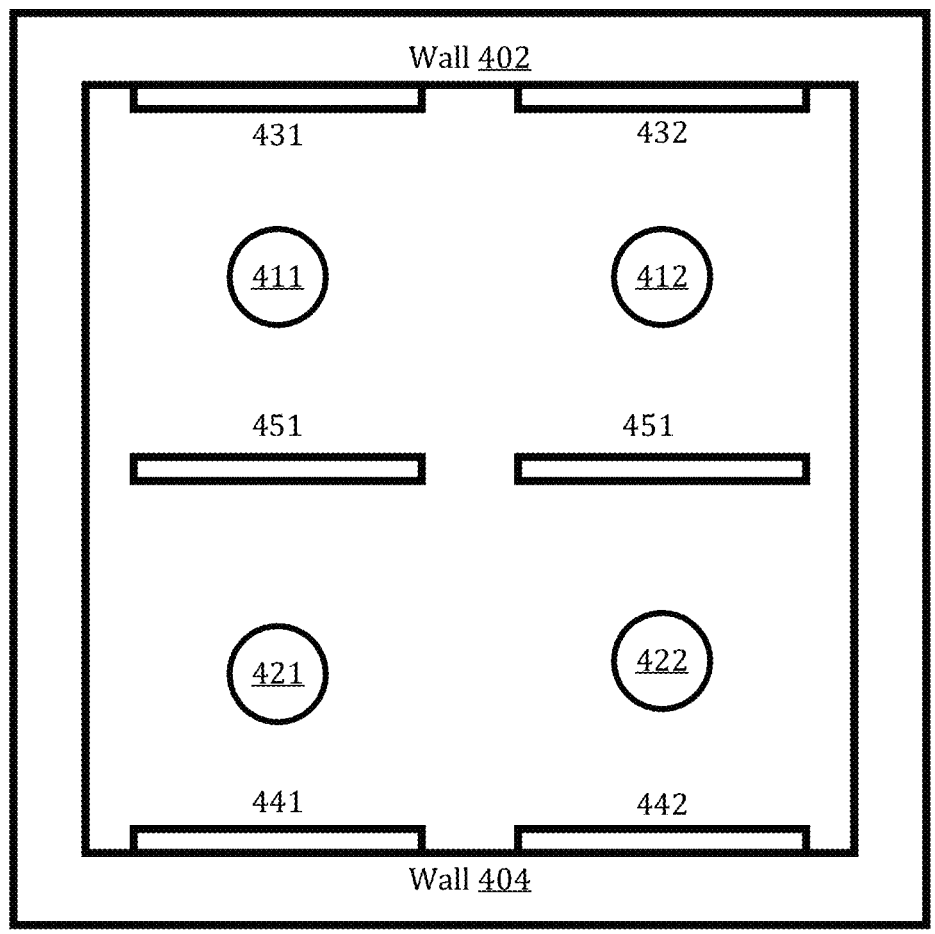
FIG. 4 is an elevational schematic view of a vapor cell for a 4-channel RF receiver.

A four-channel atom-vapor cell 400 is represented in FIG. 4 including a hermetically sealed glass structure with opposing walls 402 and 404. Indium-titanium oxide (ITO) electrodes 431, 432, 441, and 442 are formed on the inner surfaces of opposing walls 402 and 404, while a common ground electrode 451 extends longitudinally through cell 400. These electrodes allow independent tuning for channels 411, 412, 421, and 422. Note that the channels in cell 400 are arranged in a two-dimensional array, whereas the channels in receiver system 100 (FIG. 1) are arranged in a one-dimensional array. Other embodiments use transparent conductive oxides (TCOs) other than ITO.

FIGS. 5A and 5B represent a one-cell per channel multi-channel system 500. The cells 511, 512, 521 ... are arranged in an n-by-m two-dimensional array, where n and m are integers. Each cell 511, 512, 521 and so on, includes a single respective channel 531, 532, 541 ....

Figure 6:
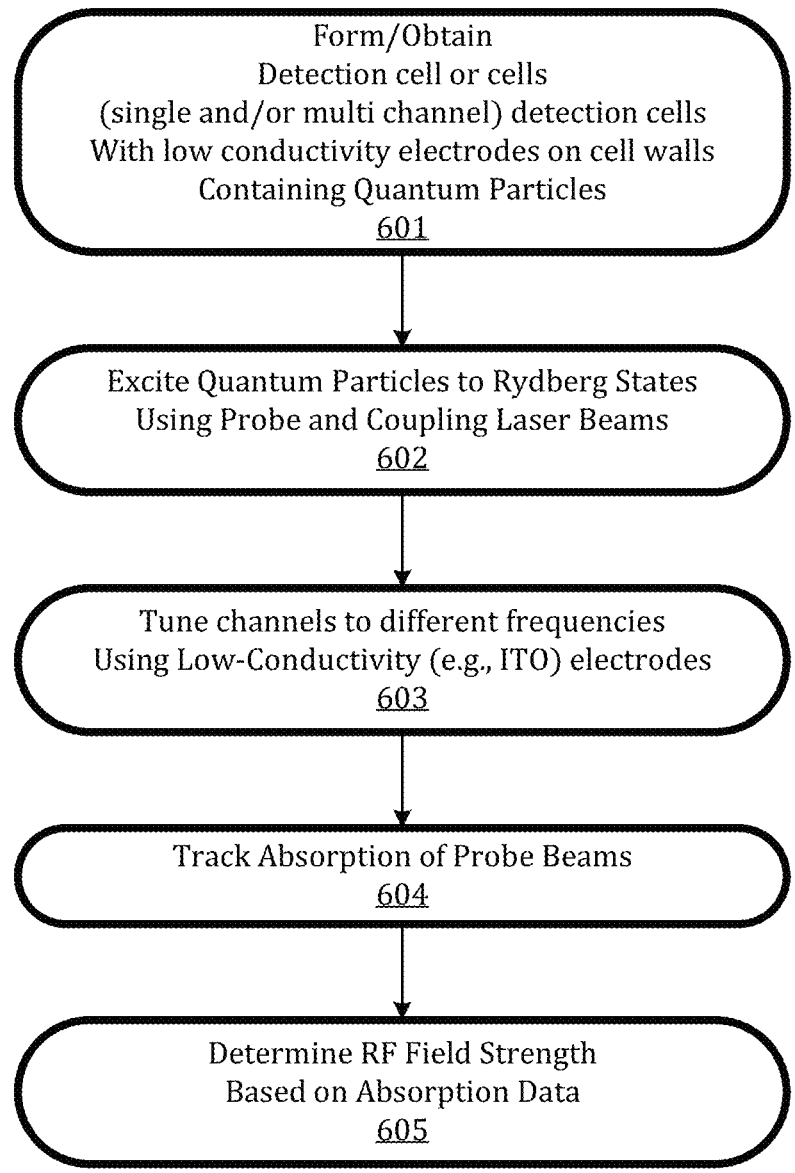
FIG. 6 is a flow chart of a multi-channel quantum-sensing radiofrequency receiver process.

A multi-channel quantum-sensing radiofrequency receiver process 600, flow-charted in FIG. 6, begins at 601 with forming or obtaining a vapor cell of quantum particles, e.g., atoms or polyatomic molecules, with low-conductivity electrodes on the cell walls to define channels. Some embodiments include a single multi-channel cell, while other embodiments can include plural cells which can include single- and/or multi-channel cells.

Each cell can contain a molecular entity capable of assuming a superposition of Rydberg states. At 602, the quantum particles are excited to a first Rydberg state using a probe and one or more coupling laser beams for a n-photon transition, where n≥2. At 603, the channels are tuned to respective relatively narrow frequency bands by applying electrical potentials across electrodes. More specifically, the RF frequency required to transition between the first Rydberg state and a second Rydberg state can be adjusted using a Stark effect due to applied electric fields. The tuning is effected by a direct current (DC) potential. However, an alternating (AC) potential can be applied to demodulate an RF signal.

At 604, for each channel, the absorption of the respective probe beam by the quantum particles is tracked, e.g., using a photodetector positioned to detect the probe beam after it has passed through the quantum particles. An absorption peak is maximal in the absence of an RF field at the frequency to which the channel is tuned and decreases with RF intensity in the tuned frequency. Thus, tracking the absorptions of probe beams in the channels gives, at 605, a parallel readout of RF intensity in each single-channel frequency range within the wider frequency range of the receiver system.

The |60S7/2⟩→|60G9/2⟩ transition between Rydberg states provides for detection of frequencies near the lower limit of UHF frequencies and in the range of 380±0.2 MHz. Applying electric fields to modify the transition to differentially tune channels can extend the range to 380±2.0 MHz. Further bandwidth broadening can be achieved using different Rydberg transitions associated with the same or a different quantum-particle species. For example, one Rydberg transition can be for 87Ru and another for 133Cs. Likewise, center frequencies higher in the UHF range and frequencies in the VHF range can be tracked by corresponding selections of Rydberg transitions.

Herein, a "system" is a group of interacting or interrelated elements that act according to a set of rules to form a unified whole. A "process" is a system in which the elements are actions. "Quantum" is an adjective characterizing a system as exhibiting or using quantum-mechanical phenomena such as eigenstates (solutions to Schrodinger's time dependent or time independent Wave Equation), superposition, and entanglement. Quantum states are eigenstates and superpositions of eigenstates. Herein, "quantum particle" is synonymous with "molecular entity." A "molecular entity" is "any constitutionally or isotopically distinct atom, molecule, ion, ion pair, radical, radical ion, complex, conformer, etc., identifiable as a separately distinguishable entity". "Quantum-sensing" means sensing using quantum phenomena such as superpositions of Rydberg states.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided herein along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Herein, art labelled "prior art, if any, is admitted prior art; art not labelled "prior art", if any, is not admitted prior art. The illustrated embodiments, variations thereupon and modifications thereto are provided for by the present invention, the scope of which is defined by the accompanying claims.

What is claimed is:

1. A quantum-sensing radiofrequency receiver system comprising:
    plural channels, each channel containing molecular entities, the molecular entities of each cell being hermetically sealed within a respective cell, a first channel containing the molecular entities hermetically sealed within a first cell, each of the molecular entities having plural Rydberg states;
    a laser system for exciting the molecular entities of each channel to Rydberg states using a respective probe laser beam and at least one respective coupling laser beam;
    a photodetector system for tracking a respective intensity of each respective probe laser beam after it passes through the molecular entities of a respective channel; and
    a tuning system for tuning each channel by altering a resonance frequency for transitions between Rydberg states of the molecular entities of the channel so that different channels are tuned to respectively different frequencies.

2. The quantum-sensing radiofrequency receiver system of claim 1 wherein the molecular entities contained by different channels are contained by different cells.

3. The quantum-sensing radiofrequency receiver system of claim 1 wherein the molecular entities of the plural channels are hermetically sealed within the first cell and the molecular entities contained by different channels are not hermetically sealed from each other.

4. The quantum-sensing radiofrequency receiver system of claim 3 wherein the tuning system uses a Stark effect to tune the channels.

5. The quantum-sensing radiofrequency receiver system of claim 4 wherein the first cell has cell walls, the Stark effect being applied using electrodes formed on the cell walls.

6. The quantum-sensing radiofrequency receiver system of claim 5 wherein the electrodes contain material other than metal.

7. The quantum-sensing radiofrequency receiver system of claim 6 wherein the material is indium-tin-oxide (ITO).

8. The quantum-sensing radiofrequency receiver system of claim 1 wherein the channels are spatially parallel.

9. The quantum-sensing radiofrequency receiver system of claim 1 wherein the channels are arranged in a one-dimensional array.

10. The quantum-sensing radiofrequency receiver system of claim 1 wherein the channels are arranged in a two-dimensional array.

11. A quantum-sensing radiofrequency receiver process comprising:
exciting, using probe laser beams and coupling laser beams, molecular entities in plural channels to Rydberg states, the molecular entities of each channel being hermetically sealed within a respective cell, the molecular entities of a first channel being hermetically sealed within a first cell;
tuning the channels to different frequencies; and
tracking absorption of the probe laser beams once they have passed through the molecular entities.

12. The quantum-sensing radiofrequency receiver process of claim 11 wherein the molecular entities of different channels are contained by different cells so that the molecular entities of one channel are hermetically sealed from the molecular entities of a second channel.

13. The quantum-sensing radiofrequency receiver process of claim 11 wherein the molecular entities of the plural channels are hermetically sealed within the first cell and the molecular entities contained by different channels are not hermetically sealed from each other.

14. The quantum-sensing radiofrequency receiver process of claim 13 wherein the tuning uses a Stark effect to tune the channels.

15. The quantum-sensing radiofrequency receiver process of claim 14 wherein the first cell has cell walls, the Stark effect being applied using electrodes formed on the cell walls.

16. The quantum-sensing radiofrequency receiver process of claim 15 wherein the electrodes include material other than metal.

17. The quantum-sensing radiofrequency receiver process of claim 16 wherein the material is indium-tin-oxide (ITO).

18. The quantum-sensing radiofrequency receiver process of claim 11 wherein the channels are spatially parallel.

19. The quantum-sensing radiofrequency receiver process of claim 11 wherein the channels are arranged in a one-dimensional array.

20. The quantum-sensing radiofrequency receiver process of claim 11 wherein the channels are arranged in a two-dimensional array.

* * * * *